United States Patent
Kosakai

(10) Patent No.: US 6,556,414 B2
(45) Date of Patent: Apr. 29, 2003

(54) ELECTROSTATIC AND VACUUM CHUCKING HOLDING APPARATUS

(75) Inventor: Mamoru Kosakai, Funabashi (JP)

(73) Assignee: Sumitomo Osaka Cement Co., Ltd., Tokyo (JP)

(*) Notice: Subject to any disclaimer, the term of this patent is extended or adjusted under 35 U.S.C. 154(b) by 21 days.

(21) Appl. No.: 09/872,488

(22) Filed: May 31, 2001

(65) Prior Publication Data

US 2002/0036373 A1 Mar. 28, 2002

(30) Foreign Application Priority Data

Jun. 2, 2000 (JP) ........................................ 2000-166708

(51) Int. Cl.⁷ .............................................. H02N 13/00
(52) U.S. Cl. ....................................................... 361/234
(58) Field of Search ................................. 361/234, 235, 361/230; 279/128

(56) References Cited

FOREIGN PATENT DOCUMENTS

| JP | 05-006933 | 1/1993 | ........... H01L/21/68 |
|---|---|---|---|
| JP | 07-153825 | 6/1995 | ........... H01L/21/68 |
| JP | 09-213777 | 8/1997 | ........... H01L/21/68 |
| JP | 10-233434 | 9/1998 | ........... H01L/21/68 |
| JP | 11-233600 | 8/1999 | ........... H01L/21/68 |

*Primary Examiner*—Edward H. Tso
(74) *Attorney, Agent, or Firm*—Sierra Patent Group, Ltd.

(57) ABSTRACT

This invention provides an attraction holding apparatus for holding a plate-shaped specimen to improve the uniformity of surface temperatures in microscopic regions of the specimen while exhibiting sufficient holding strength and detachability after the impressed voltage is removed (in the case of electrostatic chucking), without causing degradation in the chemical and mechanical properties at the surfaces contacting the specimen, such as the upper surfaces of the protrusions, and without having to introduce excessive amount of gas. This attraction holding apparatus is constituted by a flat base and a plurality of protrusions erected in the attachment region in the flat base, so that the plate-shaped specimen is held on the protrusions. Each upper surface of the protrusions is constituted by a specimen holding surface and a concavity. According to this invention, uniformity of surface temperatures in the microscopic regions of the specimen is improved, without causing degradation in the chemical and mechanical properties of the protrusion formed inside the attachment region and without introducing excessive amount of gas.

14 Claims, 5 Drawing Sheets

ELECTROSTATIC AND VACUUM CHUCKING HOLDING APPARATUS

PRIORITY CLAIM

This application claims priority form Japanese Patent Application Serial No. 2000-166708, filed Jun. 2, 2000.

BACKGROUND OF THE INVENTION

1. Field of the Invention

This invention relates to a holding apparatus for affixing an object by attractive forces. In further detail, this invention relates to a holding apparatus for clamping a plate-shaped object such as silicon wafer, printing substrate, glass substrate and the like by attraction means such as electrostatic chucking and vacuum chucking.

2. Background Technology

Conventionally, as a technology of holding a plate-shaped specimen in place, holding apparatuses for affixing an object in place by attractive forces have been known, in the form of vacuum chucking, electrostatic chucking and the like. Such attraction holding apparatuses are used, for example, for transporting plate-shaped specimens and for clamping such plate-shaped specimens during processing such as light exposure, film deposition, micro-fabrication, cleaning and dicing and the like.

In such an attraction holding apparatus, on the opposing surface of the attraction holding apparatus that faces the specimen, latticed slits or protrusions or holes are formed, so that surfaces contacting the specimen and surfaces not contacting the specimen are created. In so doing, in the case of the electrostatic holding, creation of non-contacting surfaces on the plane opposite to the specimen enables to facilitate detachability after the applied voltage is removed, or, in the case of vacuum chucking, it enables to maintain a vacuum between the attachment surface and the specimen by connecting the space between the lower surface of the specimen and the non-contacting surface to an evacuation apparatus. Further, in either type of attraction holding methods, the presence of the non-contacting surface prevents intrusion of dust and foreign particles in-between the contacting surface and the specimen.

Also, when a plate-shaped specimen is to be subjected to processing steps such as etching in a plasma atmosphere, it is necessary to perform such a process under a reduced pressure, i.e., in an environment to promote the formation of plasma. When processing the plate-shaped specimen, for example, etching of semiconductor wafers in a plasma atmosphere, the surface of the semiconductor wafers are heated to high temperatures due to plasma heating. Then, as the surface heats up, problems such as bursting of the resist film formed on the surface may occur. Also, if the temperature distribution on the specimen surface is non-uniform, resulting chemical processing would be non-uniform. Therefore, to provide uniform chemical processing of the plate-shaped specimen, attraction holding apparatus based on electrostatic chucking is designed so as to cool the surface temperature of the plate-shaped specimen uniformly by flowing a cooling gas such as helium through the space between the lower surface of the plate-shaped specimen and the non-contacting surface.

In this case, higher cooling effect is obtained by increasing the surface area of the non-contacting surface as much as possible. However, if the area of the contacting surface is made too small in an attempt to increase the surface area of the non-contacting surface, attraction force would be reduced. Therefore, attempts are made to obtain sufficient attraction force even with small area of attachment surfaces, such as increasing the degree of smoothness of the contacting surface. For example, a Japanese Patent Application, First Publication Hei 7-153825, disclose an electrostatic chuck such that the specific resistance of the dielectric layer is less than $10^9 \Omega m$, Rmax (maximum height) of the upper surface of a plurality of protrusions that serve as the attachment surface is less than 2.0 m, or Ra (center line average roughness) is less than 0.25 μm, and an area ratio of the total surface area of the upper surface of the protrusions to the upper surface area of the dielectric layer is more than 1% and less than 10%.

Also known is a holding apparatus that can perform clamping and heating of the plate-shaped specimen concurrently. This holding apparatus is constructed so that the plate-shaped specimen is heated by flowing electrical current through an internally housed heater so as to affix the plate-shaped specimen to the attachment surface of the holding apparatus while heating the attachment surface so as to heat the plate-shaped specimen.

In such a holding apparatus also, it is required to produce a uniform surface temperature to provide uniform chemical processing of the plate-shaped specimen. For this reason, a gas such as helium is flowed in the space between the lower surface of the plate-shaped specimen and the non-attaching surface so as to distribute the heating effect of the heater over the entire surface of the plate-shaped specimen.

As described above, to form non-attaching surfaces opposing the specimen on the holding apparatus serves not only to improve detachability, secure a suction path for providing vacuum suction and prevent adhesion of dust particles, but also to play an important role of providing uniform chemical processing to the plate-shaped specimen by equalizing the temperature of the plate-shaped specimen.

However, in the conventional attraction holding apparatus having non-attaching surfaces described above has not always produced uniform temperature in terms of microscopic regions of the plate-shaped specimen. It is because the contacting surface conducts heat much more readily relative to the non-attaching surfaces so that, in the case of heating the plate-shaped specimen using a heater, those regions in contact with the attachment surface tend to reach higher temperatures than those not in contact, and, in the case of heating the plate-shaped specimen with plasma and the like, non-contact regions tend to reach higher temperatures because they provide no place for the heat to drain away.

Especially, if it is not able to introduce a gas such as helium, adverse effects caused by non-uniform temperature due to reasons cited above have been noted. Even in those cases that allow a gas such as helium to be introduced, the effect of equalizing the temperature due to helium gas is difficult to reach, from microscopic viewpoint, to the contacted portions of the plate-shaped specimen that are touching the attaching surface, and it has been difficult to obtain sufficient temperature uniformity. Here, although it may be expected that increasing the pressure of the gas such as helium would increase the temperature homogenizing effect, but excessive gas pressure is not appropriate because it introduces problems such as breakage of the plate-shaped specimen.

To resolve microscopic non-uniformity in temperature distribution on the surface of the plate-shaped specimen described above, it is effective to reduce the area of attachment as much as possible, and for example, when numerous protrusions are erected, it is effective to reduce the upper surface area of each protrusion as much as possible.

However, if the area of attachment surface is reduced, resistance to chemical attack is lowered and the protrusions become vulnerable to damage, and further, peripheries of the attachment surface becomes vulnerable to wear due to contact with the plate-shaped specimen.

SUMMARY OF THE INVENTION

This invention is provided in view of the background information described above, and an object is to provide a holding apparatus that improves the uniformity of surface temperatures in microscopic regions of a plate-shaped specimen while exhibiting sufficient holding strength and detachability after impressed voltage is removed (in the case of electrostatic chucking), without causing degradation in the chemical and mechanical properties at the attachment surfaces contacting the specimen, such as the upper surfaces of the protrusions, and without having to introduce excessive amount of gas.

It has been found, after intensive studies, that the above problem can be resolved effectively by modifying the apex shape of the protrusions that traditionally have been made into a simple flat apex, to lead to completion of this invention.

That is, the holding apparatus of this invention comprises a flat base, and a plurality of protrusions erected in the attachment region in the flat base, for attraction fixation of a plate-shaped specimen on the plurality of protrusions, wherein each upper surface of the protrusions is comprised by a specimen holding surface and a concavity.

According to this invention, because a portion of the upper surface of each protrusion is made non-contacting, so that difference in the manner of heat conduction through the portions of the attachment region that have no protrusions (referred to as grooves hereinbelow) and through the overall upper surfaces can be minimized. And therefore, it enables to homogenize the temperature of the plate-shaped specimen even from a microscopic viewpoint. In this case, although the concavity may be formed in any shape in any location, it is preferable that it is formed in a location surrounded by the specimen holding surface. In so doing, it becomes more difficult to damage the specimen holding surface even if it touches the specimen, and furthermore, heat transfer is lower in closed spaces, and therefore, it is possible to further homogenize the temperature of the specimen even from a microscopic viewpoint.

Also, a width of the specimen holding surface is not more than twice a thickness of a plate-shaped specimen to be clamped. Here, the width of the specimen holding surface means a spacing between the outer periphery of the protrusion upper surface and the outer periphery of the concavity surrounded by the specimen holding surface. By so doing, the difference in the manner of heat conduction through the grooves and through the protrusion upper surfaces can be further minimized, so that it is possible to further homogenize the specimen temperature even from a microscopic viewpoint.

Also, it is preferable that an area ratio of a total area of the specimen holding surfaces to a total area of upper surfaces of the protrusions be in a range of 10–90%. By so doing, sufficient adhesion strength and uniformity of specimen temperature can be secured at the same time. That is, if the area ratio is less than 10%, sufficient adhesion strength cannot be obtained, and if the area ratio exceeds 90%, it means, in effect, that the concavities are not formed on the protrusions, so that it becomes difficult to homogenize the specimen temperature.

Another holding apparatus of this invention is provided with a flat base, and a plurality of protrusions erected in the attachment region in the flat base, for adhesion fixation of a plate-shaped specimen on the plurality of protrusions, wherein each upper surface of the protrusion is comprised by a planar region having a center line average roughness of not more than 0.5 μm and a rough region having a center line average roughness of not less than 0.5 μm.

According to this invention, roughening portions of the upper surface of each protrusion enables to lower the degree of intimate contact between the roughened portions and the plate-shaped specimen, so that the difference in the manner of heat conduction through the grooves and through the protrusion upper surfaces can be minimized. And therefore, it is possible to homogenize the specimen temperature even from a microscopic viewpoint.

Here, the reason for specifying the center line average roughness of the planar regions to be less than 0.5 μm and the center line average roughness of the rough regions to be more than 0.5 μm is that, the thermal conductivity behaviors differ significantly through the planar regions having the center line average roughness of less than 0.5 μm and through the rough regions having the center line average roughness of more than 0.5 μm, across the boundary value of 0.5 μm of the center line average roughness. And, it is possible to secure sufficient adhesion strength by producing the center line average roughness of less than 0.5 μm in the planar regions.

In this case, although the rough region can be formed in any location of the upper surface of the protrusions, it is preferable that the rough region be formed in a location surrounded by the planar region. In so doing, it becomes more difficult to damage the specimen holding surface even if it touches the specimen, and furthermore, heat transfer is lower in closed spaces, and therefore, it is possible to further homogenize the temperature of the specimen even from a microscopic viewpoint.

Also, it is preferable that a width of the planar region is not more than twice a thickness of a plate-shaped specimen to be clamped. Here, the width of the specimen holding surface means a spacing between the outer periphery of the protrusion upper surface and the outer periphery of the rough region surrounded by the planar region. By so doing, the difference in the manner of heat conduction through the grooves and through the overall upper surfaces of the protrusions can be further minimized, so that it is possible to further homogenize the specimen temperature even from a microscopic viewpoint.

Also, it is preferable that an area ratio of a total area of the specimen holding surfaces to a total area of upper surfaces of the protrusions be in a range of 10–90%. In so doing, it is possible to secure sufficient adhesion strength and the temperature uniformity of the plate-shaped specimen at the same time. That is, if the area ratio is less than 10%, necessary adhesion strength cannot be secured while, if the area ratio exceeds 90%, it means in effect that rough regions have not been formed, and it becomes difficult to homogenize the temperature of the plate-shaped specimen.

It has thus been possible to provide a holding apparatus that enables to improve the uniformity of surface temperatures in microscopic regions of a plate-shaped specimen while exhibiting sufficient holding strength and detachability after the impressed voltage is removed (in the case of electrostatic chucking), without causing degradation in the chemical and mechanical properties at the surfaces contacting the specimen, such as the upper surfaces of the protrusions, and without having to introduce excessive amount of gas.

SIMPLE EXPLANATION OF THE DRAWINGS

Figure 2A:
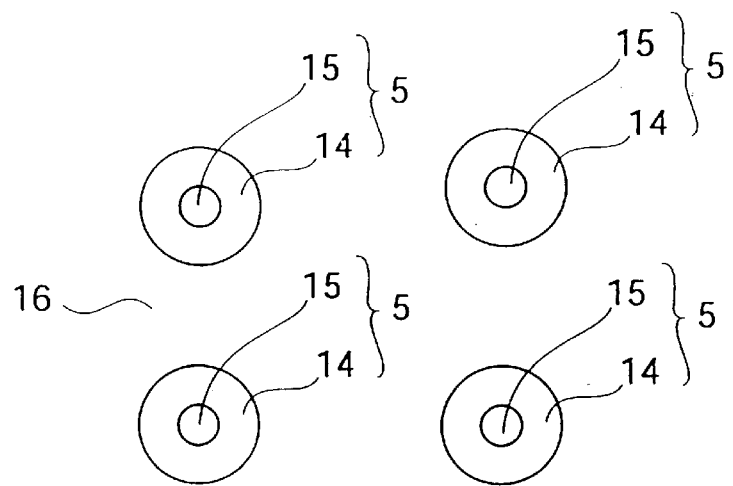
FIG. 2 is a diagram of essential sections of the electrostatic chuck in a first embodiment of this invention, and FIG.
Figure 2B:
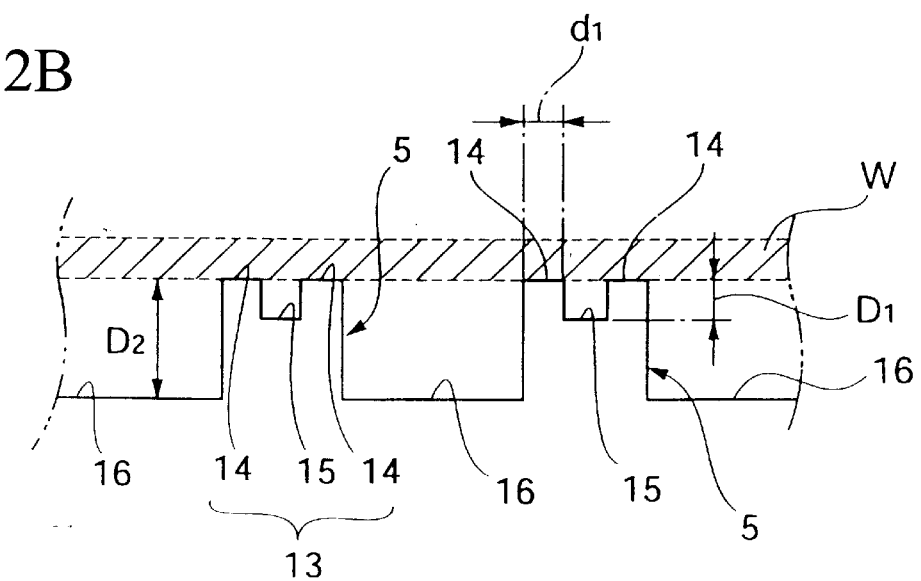

2A relates to a plan view, and FIG. 2B relates to a cross sectional view.

FIGS. 3A–3D are process diagrams to show a manufacturing method for the electrostatic chuck in the first embodiment of this invention.

Figure 4A:
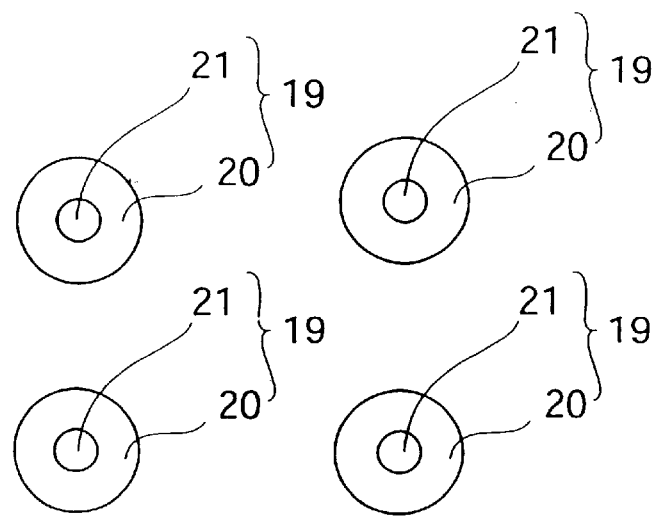
Figure 4B:
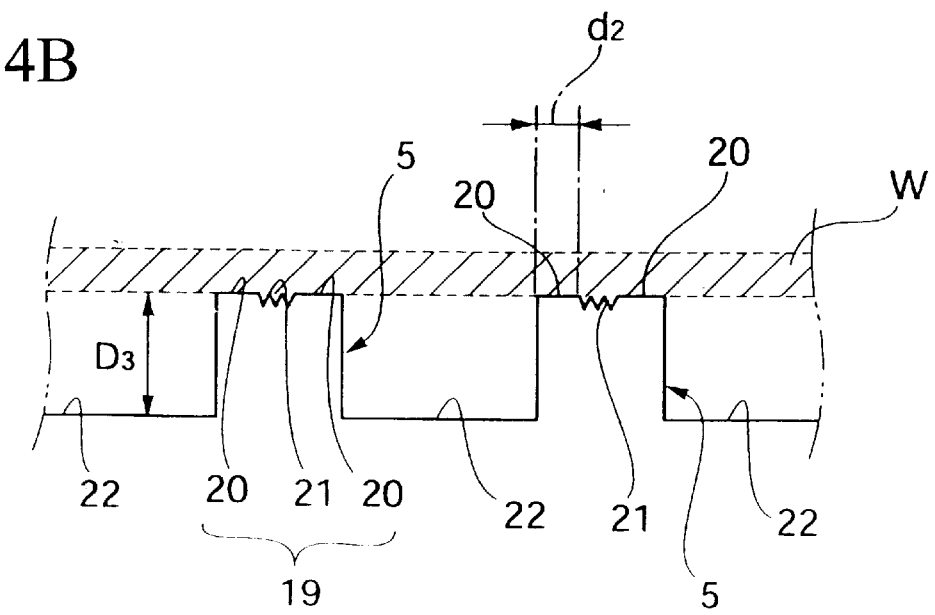
Figure 5A:
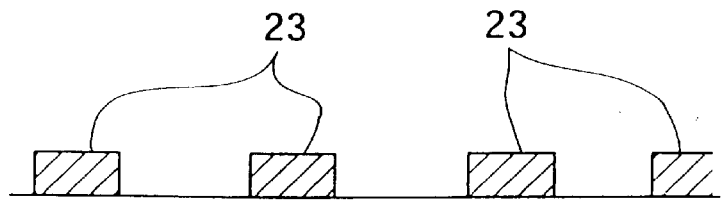
Figure 5B:
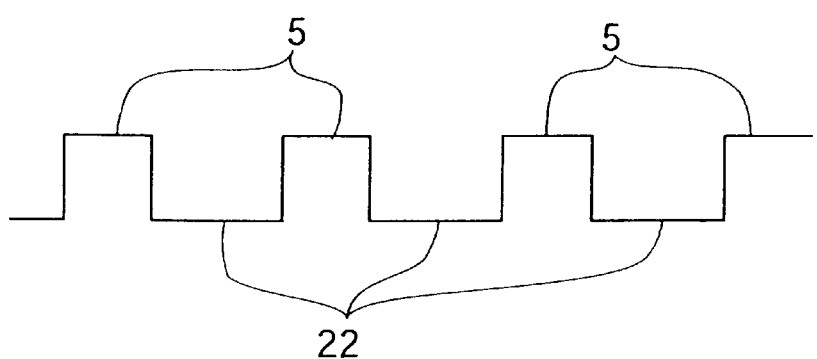
Figure 5C:
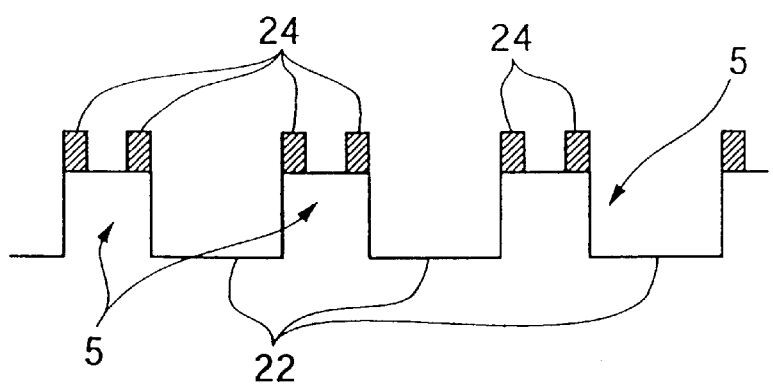
Figure 5D:
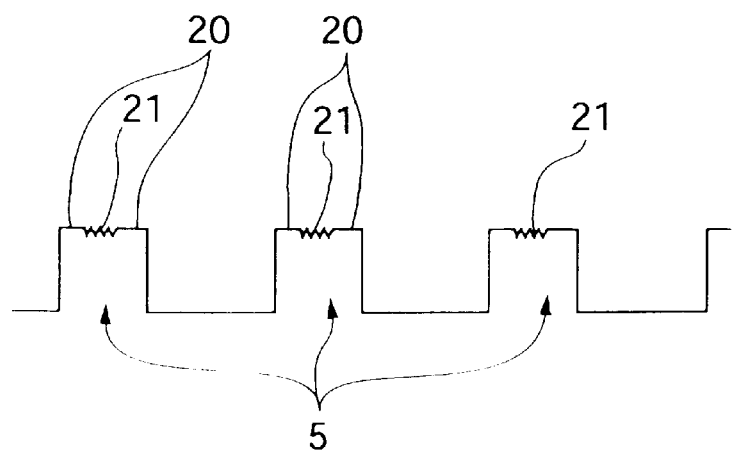

FIGS. 4A–4B are diagrams of essential sections of an electrostatic chuck in a second embodiment of this invention, and 4A relates to a plan view, and 4B relates to a cross sectional view.

FIGS. 5A–5D are process diagrams to show a manufacturing method for the electrostatic chuck in the: second embodiment of this invention.

DETAILED DESCRIPTION

In the following, preferred embodiments will be explained with reference to the attached drawings, using examples of electrostatic type chucks that does not have an integral heater.

Embodiment 1

Figure 1A:
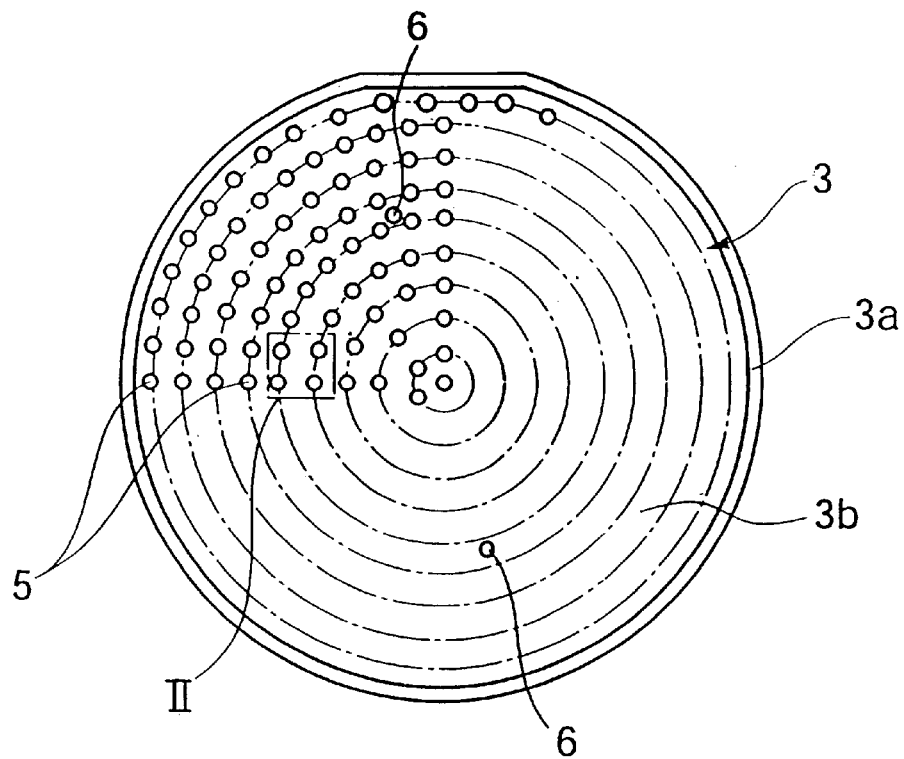
FIG. 1 is a diagram of an electrostatic chuck in a first embodiment of this invention, and FIG. 1A relates to a plan view, and FIG. 1B relates to a cross sectional view.
Figure 1B:
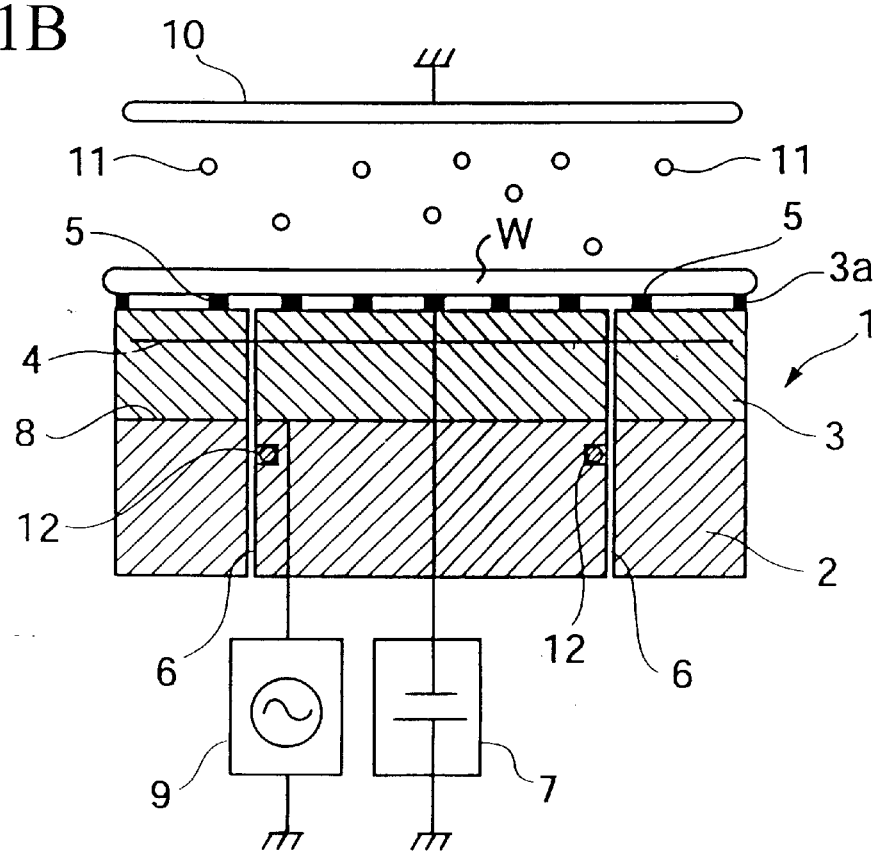

FIG. 1 is a diagram to show an electrostatic chuck in the first embodiment, FIG. 2 is a diagram of essential sections of the electrostatic chuck. Here, FIG. 2 is an enlarged diagram of the key sections in region II shown in FIG. 1. Also, in FIGS. 1 and 2, a plan view is shown in each (*a*) and a cross sectional view is shown in each (*b*). As shown in the diagrams, the electrostatic chuck 1 is comprised by joining a dielectric layer 3 serving as a planar substrate on top of a metal plate 2, in which an internal electrode 4 is embedded or supported inside the dielectric layer 3.

On the upper surface of the dielectric layer 3, a peripheral wall 3*a* having a width of 1–5 mm and a height equal to the protrusions 5 to be described later is formed so as not to leak the cooling gas such as helium, and the inside region is designated as the attachment region 3*b*, and a plurality of protrusions 5 are erected inside the attachment region 3*b*. Here, the peripheral wall 3*a* and the protrusions 5 may be formed integrally with the dielectric layer 3 or formed as separate members.

As shown in FIG. 2, protrusions 5 are formed into concavities and convexities so that each upper surface 13 is constituted by a specimen holding surface 14 comprised by the tops of the convexities, and by the concavities 15 surrounded by the specimen holding surface 14. The specimen holding surfaces 14 serve as the attachment surface of the holding apparatus to directly contact a wafer W. Also, in the attachment region 3*b*, the regions not having the protrusions 5 are left as groove sections 16.

Here, as shown in FIG. 1, cooling gas introduction holes 6 are formed to bore through the metal plate 2 and the dielectric layer 3, and a cooling gas such as He is supplied to a space formed between the upper surface of the dielectric layer 13 and the lower surface of the wafer W. Further, in the interior of the metal plate 2, a fluid passages 12 are provided to flow a cooling medium for cooling the electrostatic chuck.

A direct current circuit 7 is connected to the internal electrode 4, and a high frequency power circuit 9 is connected to the conductor section 8 on the lower surface of the dielectric layer 3. Also, the high frequency power circuit 9 may be connected to the internal electrode 4. Here, inside the plasma processing apparatus, a grounded opposing electrode 10 is positioned above the electrostatic chuck 1. Therefore, by placing a wafer W on the electrostatic chuck 1, and by impressing dc current on the internal electrode 4, static electricity is generated, and the wafer W is attracted to the dielectric layer 3, specifically it is drawn to the specimen holding surfaces 14 and the peripheral wall 3*b*, which are located on the upper surface of the protrusions 5.

Also, by impressing a high frequency signal using the high frequency power circuit 9, active radicals 11 are generated by interaction with the opposing electrode 10, and the silicon oxide and the like formed on the surface of the wafer W are etched.

Also, as shown in FIG. 2, the area ratio of the total area of the specimen holding surfaces 14 to the total area of the attachment region 3*b* (area remaining after subtracting the area of the peripheral wall 3*a* from the area of the dielectric layer 3) should be 0.5–30%, preferably in a range of 1–10%. The reason for limiting the area ratio to higher than 0.5% is to make it difficult for the dust particles existing on the attachment surface to adhere to the surfaces and to secure detachability of the plate-shaped specimen after voltage impressing is stopped.

Also, it is preferable that area ratio of the total area of the specimen holding surfaces 14 to the total area of the upper surfaces 13 of the protrusions 5 (sum of the areas of the specimen holding surfaces 14 and the concavities 15) be in a range of 10–90%.

That is, by selecting the area ratio in the range specified above, it is possible to secure sufficient adhesion force as well as temperature uniformity of the plate-shaped specimen at the same time. In this case, the reason for selecting the area ratio in the above range is that, if the area ratio is lower than 10%, sufficient adhesion force is not obtained and, if the area ratio exceeds 90%, it means in effect that M-sections are not formed on the upper surface of the protrusions, and it becomes difficult to homogenize the temperature of the plate-shaped specimen.

Further, it is preferable that the width dl of the holding sections 14 be lower than twice the thickness of the plate-shaped specimen. The reason for limiting the width d1 of the holding sections 14 is that, when the width d1 of the holding sections 14 is higher than two times, it becomes difficult to lessen the difference between thermal conductivity coefficients in the groove sections 16 and in the upper surfaces (specimen holding surfaces 14+concavities 15) 13 so that a temperature differential is created between the groove sections 16 and the upper surfaces (specimen holding surfaces 14+concavities 15) 13, and it becomes difficult to improve the uniformity of surface temperatures in the microscopic regions of the plate-shaped specimen.

It is preferable the fabrication depth D1 of the concavities 15 be in a range of 0.1–2.0 $\mu$m. The reason is that, if the fabrication depth D1 is less than 0.1 $\mu$m. it means in effect that concavities 15 are not formed, and it becomes difficult to improve the uniformity of surface temperatures in the microscopic regions of the plate-shape specimen. And, if the fabrication depth D1 is greater than 2.0 $\mu$m, adhesion force tends to drop.

It is preferable that the fabrication depth D2 of the groove sections 16 be in a range of 1–20 $\mu$m. The reason is that, if the fabrication depth D2 is less than 1 $\mu$m, it becomes difficult to flow a gas such as helium along the lower surface of the plate-shaped specimen, also, dust adhesion prevention becomes ineffectual, and the adhesion force is lowered because the plate-shaped specimen W is lifted from the holder, and it becomes difficult to improve the uniformity of surface temperatures in the microscopic regions of the plate-shaped specimen. And, it is not desirable if the fabrication depth is greater than 20 $\mu$m, because the adhesion force in the groove sections 16 is decreased and overall adhesion strength is decreased.

Forming of the protrusions and micro-fabrication of the upper surfaces of the protrusions may be performed, for example, using mechanical fabrication such as stone grinding and laser curving or shot blasting. In the following, a method for forming concavities and convexities inside the attachment region 3b will be explained with reference to FIG. 3, using an example of fabrication by shot-blasting.

First, the wafer placement surface (attachment region 3b) is planarized by polish fabrication (centerline average roughness Ra1 to be less than 0.5 $\mu$m), and the planarized wafer placement surface (attachment region 3b) is cleansed. The cleansing is performed in an organic solvent for degreasing, using trichloroethylene for example. After such a cleansing step, warm water is used for rinsing.

Figure 3A:
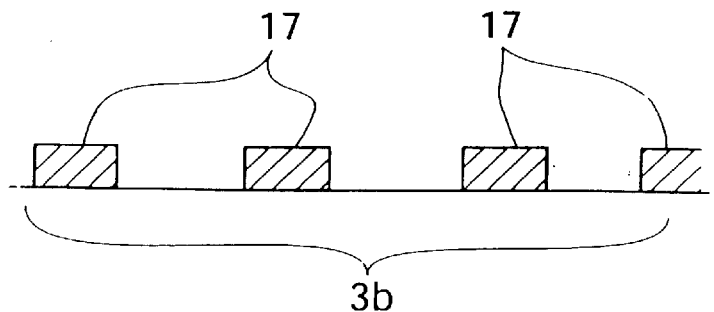

Next, a mask 17 is formed on the wafer placement surface (attachment surface 3b), as shown in FIG. 3(a). The pattern shape of the mask 17 is the same as the pattern shape of the protrusions 5 shown in FIG. 1. Mask 17 is made of a photo-sensitive resin or a plate-shaped mask. This method is according to conventional methods.

Figure 3B:
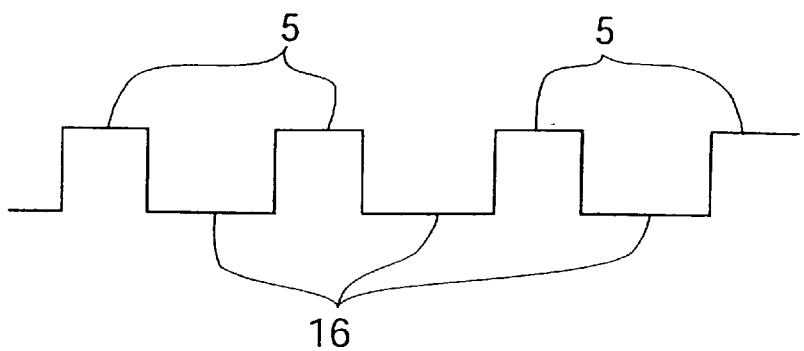
Figure 3C:
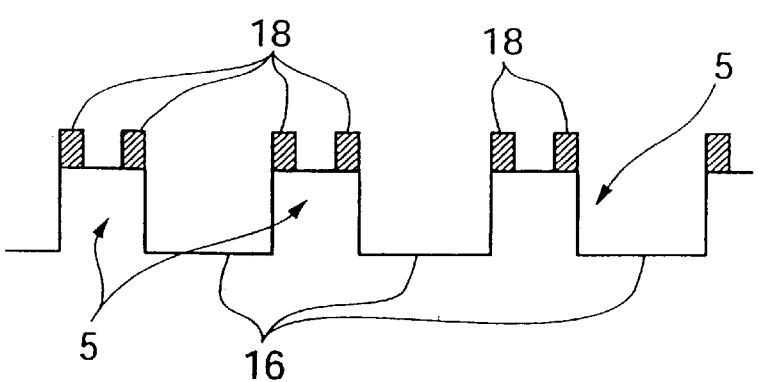
Figure 3D:
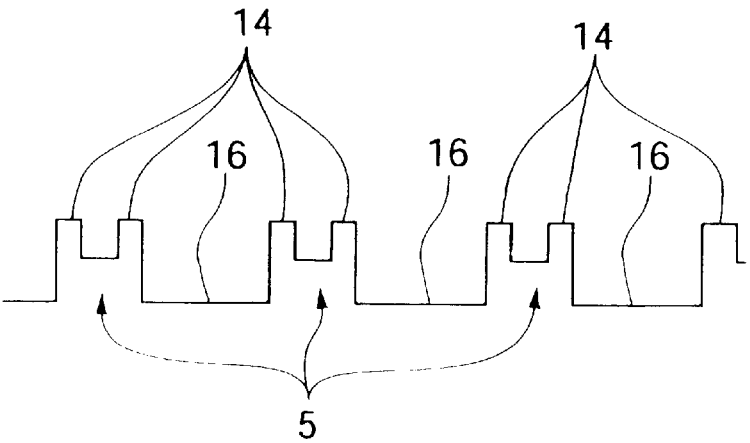

Next, shot-blasting is performed, and as shown in FIG. 3(b), and groove sections 16 are formed in the regions not covered by the mask 17. The protrusions 5 are formed as a result. Here, it is preferable to use alumina, silicon carbide or glass beads for the particles used in shot-blasting, and the diameter of the particles should be in a range of less than 300 mesh and higher than 1500 mesh. After this step, the mask 17 is removed. In this case, when the mask 17 is made of a photo-sensitive resin, a detaching solution such as methylene chloride is used.

Next, on top of the protrusions 5, a mask 18 is applied as shown in FIG. 3 (c). The shape of mask 18 is made the as the shape of the pattern of the concavities and convexities and convexities formed on the protrusions 5. Then, according to the steps of shot-blasting described above, shot-blasting is again performed to form the concavities 15 as shown in FIG. 3 (d) in those regions not covered by the mask 18. Then, the mask 18 is removed to obtain the electrostatic chuck shown in FIGS. 1, 2.

An 8-inch wafer was chucked on the electrostatic chuck thus produced while flowing He gas through the groove sections 16 at 1.33×10³ Pa (10 torr), and the electrostatic adhesion strength, adhesion time and detaching time were determined at room temperature and at 150° C., respectively.

In the case of this electrostatic chuck, area ratio of the total area of the specimen holding surfaces 14 to the total area of the attachment regions 3b was 5%, and the area ratio of the total area of the specimen holding area to the total area of the upper surfaces 13 of the protrusions 5 was 8%, and the width d1 was 0.5 times the thickness of the plate-type specimen, and D1 was 2.4 $\mu$m and D2 was 3.0 $\mu$m.

Here, it should be noted that the adhesion time indicates a time interval between an event of impressing a dc voltage at 500 V and an event to reach an adhesion force of 100 gf/cm², i.e., about 9800 Pa, and that the detaching time indicates a time interval between an event of applying a dc voltage at 500 and stopping the application for one minute and waiting to reach an adhesion force of 10 gf/cm², i.e., about 980 Pa.

Also, the electrostatic chuck was installed on a plasma etching apparatus, and 50,000 wafers of 8-inch diameter were exposed for one minute to a mixed-gas plasma containing 20 v/o $CF_4$ and 80 v/o $O_2$ at 1.33×10² Pa (1.0 torr), and the protrusions 5 were observed to have suffered no chemical corrosion or erosion.

Also, the etched amount (depth of etching) of the SiO2 film formed on the wafer was measured.

The results of such measurements are shown in Table 1.

Embodiment 2

The electrostatic chuck in this embodiment differs from the electrostatic chuck in Embodiment 1 in the shape of protrusions 5, such that the shape is not the one shown in FIG. 2 but is the one shown in FIG. 4.

In FIG. 4, (a) is a plan view and (b) is a cross sectional view. As shown in FIG. 4, the upper surfaces 19 of the protrusions 5 are comprised planar regions constituted by outer peripheral surfaces 20 of center line average roughness Ra of less than 0.5 $\mu$m and rough regions constituted by inner peripheral surfaces 21 of center line average roughness Ra of more than 0.5 $\mu$m, and the outer peripheral surfaces 20 are used as the attachment surface to directly contact the semiconductor wafer W. And, those regions in the attachment region 3b that do not have protrusions 5 are left as groove sections 22.

Here, the reason for specifying the center line average roughness of the planar regions to be less than 0.5 $\mu$m and the center line average roughness of the rough regions to be more than 0.5 $\mu$m is that, the thermal conductivity behavior differs significantly in the planar regions having the center line average roughness of less than 0.5 $\mu$m and in the rough regions having the center line average roughness of more than 0.5 μm, across the boundary value of the center line average roughness at 0.5 μm. And, a sufficient adhesion strength can be secured by producing the center line average roughness of less than 0.5 μm in the planar regions.

The area ratio of the total area of the outer surfaces 20 to the total area of the attachment regions 3b should be 0.5–30%, preferably in a range of 1–10%, and further, the difference in the above-noted R1 and R2 should preferably be greater than 0.2 μm.

The reason for selecting the area ratio to be more than 1% is to secure a required adhesion strength and the reason for selecting less than 30% is to make it difficult for the dust particles existing on the attachment surface to adhere, and to secure detachability of the plate-shaped specimen after stopping to impress the voltage.

Also, the reason for selecting the difference between R1 and R2 to be preferably more than 0.2 μm is to provide a meaningful difference in the surface roughness values Ra between the outer peripheral surfaces 20 and the inner peripheral surfaces 21.

Also, it is preferable that the area ratio of the total area of the outer peripheral surfaces 20 to the total area of the upper surfaces 19 be in a range of 10–90%. By selecting the area ratio in this range, it is possible to secure sufficient adhesion strength as well as the temperature uniformity of the plate-shaped specimen at the same time. The reason is that, if the area ratio is less than 10%, necessary adhesion strength cannot be secured while, if the area ratio exceeds 90%, it means in effect that rough regions have not been formed, and it becomes difficult to homogenize the temperature of the plate-shaped specimen.

Further, it is preferable that the width d2 of the outer peripheral surfaces 20 be less than twice the thickness of the plate-shaped specimen. The reason is that, if the width d2 of the outer peripheral surfaces 20 is more than two times, it becomes difficult to lessen the difference of the thermal conductivity coefficients in the grooves 22 and in the upper surfaces (outer peripheral surfaces 20+inner peripheral surfaces 21) 19 so that a temperature differential is created between the groove sections 22 and the upper surfaces 19, and it becomes difficult to improve the uniformity of surface temperatures in the microscopic regions of the plate-shaped specimen.

It is preferable that the fabrication depth D3 of the groove sections 22 formed in the attachment region 3b be in a range of 1–20 μm. The reason is that, if the fabrication depth D3 is less than 1 μm, it becomes difficult to flow a gas such as He along the lower surface of the plate-shaped specimen, and the dust adhesion prevention becomes ineffectual, and the adhesion force is lowered because the plate-shaped specimen W is lifted, and it becomes difficult to improve the uniformity of surface temperatures in the microscopic regions of the plate-shaped specimen. And, it is not desirable if the fabrication depth D3 is greater than 20 μm, because the adhesion force in the groove sections 22 is decreased and overall adhesion strength is decreased.

Forming of the protrusions and micro-fabrication of the upper surfaces of the protrusions may be performed, for example, using mechanical fabrication such as stone grinding and laser curving or shot blasting. In the following, a method for forming the protrusions and outer peripheral surfaces 20 and inner peripheral surfaces 21 inside the attachment region 3b will be explained with reference to FIG. 5, using an example of fabrication by shot-blasting.

First, following the steps outlined in Embodiment 1, the wafer placement surface (attachment region 3b) is planarized by polish fabrication (centerline average roughness Ra1 to be less than 0.5 μm), and the planarized wafer placement surface (attachment region 3b) is cleansed in a manner similar to that Embodiment 1.

Next, a mask 23 is formed on the wafer placement surface (attachment region 3b), as shown in FIG. 5. (a). Next, shot-blasting is performed to form groove sections 22, i.e., protrusions 5, as shown in FIG. 5 (b), in the regions not covered by the mask 23. The mask 17 and shot blasting conditions are the same as the same as those in Embodiment 1.

Next, on top of the protrusions 5, a mask 24 is applied as shown in FIG. 5 (c) according to the normal procedure. As shown in FIG. 4, the shape of mask 24 is the same as the shape of the pattern of the outer peripheral surfaces 20 and the inner peripheral surfaces 21 formed on the protrusions 5. Then, according to the steps of shot-blasting described above, shot-blasting is again performed to form the inner peripheral surfaces 21 having the center line average roughness of more than 0.5 μm in those regions not covered by the mask 24, as shown in FIG. 5 (d). This step is performed so that the difference between Ra1 and Ra2 will be greater than 0.2 μm. Then, the mask 24 is removed to obtain the electrostatic chuck shown in FIGS. 1, 4.

The electrostatic attraction strength, adhesion time and detaching time of the electrostatic chuck in Embodiment 2 were evaluated according to the steps described in Embodiment 1.

Here, the area ratio of the total area of the outer peripheral surfaces 20 to the total area of the attachment regions 3b was 5%, and the area ratio of the total area of the outer peripheral surfaces 20 to the total area of the protrusion apex surfaces 19 was 50%, and the width d2 was 0.5 times the thickness of the plate-type specimen, and D3 was 3.0 μm.

In the meantime, the electrostatic chuck was installed on a plasma etching apparatus, and 50,000 wafers of 8-inch diameter were exposed for one minute to a mixed-gas plasma containing 20 v/o $CF_4$ and 80 v/o $O_2$ at $1.33 \times 10^2$ Pa (1.0 torr), and the protrusions 5 were observed to have suffered no chemical corrosion or erosion. Also, the etched amount (depth of etching) of the $SiO_2$ film formed on the wafer was measured, and the results of such measurements were shown in Table 1.

Comparative Examples

Electrostatic chuck having the same construction as that in Embodiment 1 was prepared, except for the absence of the concavities and convexities on the upper surfaces 13 of the protrusions 5 located inside the attachment region 3b of the dielectric layer 3. The ratio of the total area of the apexes of the protrusions to the total area of the attachment region 3b in this electrostatic chuck was the same as that in Embodiment 1. The electrostatic attraction strength, adhesion time, detaching time and the etching properties were evaluated according to the testing method described in Embodiment 1, and the results were shown in Table 1.

As shown in Table 1, scatter in the etched amount observed in Embodiments 1 and 2 is smaller than that in the comparison example. This indicates that the electrostatic chucks in Embodiments 1, 2 exhibit superior temperature uniformity in the microscopic regions of the wafer.

TABLE 1

| | Electrostatic Attraction Characteristics | | | | | | |
|---|---|---|---|---|---|---|---|
| | Room Temperature | | | 150° C. | | | |
| | E-S Attr (kPa) | Adhesn Time (s) | Detach Time (s) | E-S Attr (kPa) | Adhesn Time (s) | Detach Time (s) | Etching Scttr (%) |
| Emb 1 | 9.8 | 1 | 1 | 11.0 | 1 | 1 | 2 |
| Emb 2 | 14.7 | 1 | 1 | 14.7 | 1 | 1 | 2 |
| Comp | 9.8 | 1 | 1 | 11.0 | 1 | 1 | 4 |

What is claimed is:

1. A holding apparatus having a flat base, and a plurality of protrusions erected in an attachment region in the flat base, for attraction fixation of a plate-shaped specimen on the plurality of protrusions, wherein each upper surface of the protrusions is comprised by a specimen holding surface and a concavity.

2. A holding apparatus according to claim 1, wherein the concavity is formed in a location surrounded by the specimen holding surface.

3. A holding apparatus according to claim 1, wherein the specimen holding surface and the concavity are formed by mechanical fabrication or by shot-blast fabrication.

4. A holding apparatus having a flat base, and a plurality of protrusions erected in an attachment region in the flat base, for attraction fixation of a plate-shaped specimen on the plurality of protrusions, wherein each upper surface of the protrusion is comprised by a planar region having a center line average roughness of not more than 0.5 $\mu$m and a rough region having a centerline average roughness of not less than 0.5 $\mu$m.

5. A holding apparatus according to claim 4, wherein the rough region is formed in a location surrounded by the planar region.

6. A holding apparatus according to claim 5, wherein a width of the planar region is not more than twice a thickness of a plate-shaped specimen to be clamped.

7. A holding apparatus according to claim 4, wherein an area ratio of a total area of the specimen holding surfaces to a total area of upper surfaces of the protrusions is in a range of 10~90%.

8. A holding apparatus according to claim 4, wherein an area ratio of a total area of the planar surfaces to a total area of the attachment regions is in a range of 0.5~30%.

9. A holding apparatus according to claim 4, wherein a difference values of the center line average roughness between the planar region and the rough region is not less than 0.2 $\mu$m.

10. A holding apparatus according to claim 4, wherein the planar regions and the rough regions are produced by mechanical fabrication or by shot-blast fabrication.

11. A holding apparatus having a flat base, and a plurality of protrusions erected in an attachment region in the flat base, for attraction fixation of a plate-shaped specimen on the plurality of protrusions, wherein each upper surface of the protrusions comprises a specimen holding surface and a concavity, wherein the concavity is formed in a location surrounded by the specimen holding surface, wherein a width of the specimen holding surface is not more than twice a thickness of a plate-shaped specimen to be clamped.

12. A holding apparatus having a flat base, and a plurality of protrusions erected in an attachment region in the flat base, for attraction fixation of a plate-shaped specimen on the plurality of protrusions, wherein each upper surface of the protrusions comprises a specimen holding surface and a concavity, wherein an area ratio of a total area of the specimen holding surfaces to a total area of the upper surfaces of the protrusions is in a range of 10–90%.

13. A holding apparatus having a flat base, and a plurality of protrusions erected in an attachment region in the flat base, for attraction fixation of a plate-shaped specimen on the plurality of protrusions, wherein each upper surface of the protrusions comprises a specimen holding surface and a concavity, wherein an area ratio of a total area of the specimen holding surfaces to a total area of the attachment regions is in a range of 0.5–30%.

14. A holding apparatus having a flat base, and a plurality of protrusions erected in an attachment region in the flat base, for attraction fixation of a plate-shaped specimen on the plurality of protrusions, wherein each upper surface of the protrusions comprises a specimen holding surface and a concavity, wherein a fabrication depth of the concavity is in a range of 0.1–2.0 $\mu$m.

* * * * *